United States Patent [19]
Larson et al.

[11] Patent Number: 6,035,522
[45] Date of Patent: *Mar. 14, 2000

[54] CIRCUIT BOARD LEVELING APPARATUS

[75] Inventors: Troy Douglas Larson, Scottsdale, Ariz.; Scott William Matuszewski, Lake Zurich, Ill.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/614,605

[22] Filed: Mar. 13, 1996

[51] Int. Cl.⁷ .................................................. H01K 43/00
[52] U.S. Cl. .............................. 29/760; 29/743; 269/903; 414/737
[58] Field of Search ............................. 29/739, 743, 760, 29/829, DIG. 44; 269/903; 414/752, 737

[56] References Cited

U.S. PATENT DOCUMENTS

| | | | |
|---|---|---|---|
| 2,782,574 | 2/1957 | Copold | 29/DIG. 44 X |
| 4,189,230 | 2/1980 | Zasio | 269/903 X |
| 4,399,988 | 8/1983 | De Shong | 29/739 X |
| 4,768,698 | 9/1988 | Brown et al. | 269/903 X |
| 4,805,316 | 2/1989 | Curti | 269/903 X |
| 4,951,240 | 8/1990 | Fukino | 364/489 |
| 5,005,814 | 4/1991 | Gumbert | 269/903 X |
| 5,037,262 | 8/1991 | Moll et al. | 269/903 X |
| 5,208,975 | 5/1993 | Hidese | 29/832 |
| 5,438,740 | 8/1995 | Carr et al. | 29/829 X |
| 5,600,881 | 2/1997 | Wanha | 29/760 X |

FOREIGN PATENT DOCUMENTS

| | | | |
|---|---|---|---|
| 3292144 | 12/1990 | Japan | 269/903 |
| 2245551 | 11/1991 | Japan | 269/903 |

OTHER PUBLICATIONS

FCP–IV Maintenance Manual, FCP–IV 4000, Fuji Machine Mfg. Co., Ltd., pp. 3–1, 3–3, 10–1, 10–2.

PIAB: Building Complete Vacuum Solutions; The PIAB Multi–Characteristic Ejector—the all new high performance vacuum pump; Warranty; Solutions; Suction Cups. Total 6 pages.

THK; LM System; Linear Motion Systems; THK Co., Ltd., Tokyo, Japan, Catalog. No. 100–1AE. Total 7 pages.

McMaster–Carr Supply Company, Catelog 98. Total 5 pages.

"Work Board Holder for Flexible Circuitry" Research Disclosure, Mar. 1987 No. 275, England, 1 page.

*Primary Examiner*—Lee W. Young
*Assistant Examiner*—Rick Kiltae Chang
*Attorney, Agent, or Firm*—Mark D. Patrick

[57] ABSTRACT

An apparatus for leveling (136) a circuit board (105) against a rail (128, 130) of a part placement machine (102) comprises a plate (200) and at least one spring (404, 506, 507, 508). The circuit board (105) can have any one of a plurality of different predetermined thicknesses. The plate (200) is positioned beneath the rail (128, 130) and has first and second sides (204, 300). The first side (204) is dimensioned to support the circuit board (105). The plate (200) is moveable to a first predetermined distance from the rail (128, 130). The first predetermined distance is no smaller than a smallest one of the plurality of different predetermined thicknesses of the circuit board (105). The at least one spring (404, 506, 507, 508) is carried on the second side (300) of the plate (200) to bias the plate towards the rail (128, 130). The at least one spring (404, 506, 507, 508) is compressible to accommodate the circuit board (105) between the plate (200) and the rail (128, 130).

20 Claims, 6 Drawing Sheets

CIRCUIT BOARD LEVELING APPARATUS

FIELD OF THE INVENTION

This invention relates generally to circuit boards and, more specifically, to an apparatus for leveling circuit boards.

BACKGROUND OF THE INVENTION

Many electronic devices include one or more circuit boards comprising electronic components assembled on a circuit board panel. In order to manufacture high quality electronic devices in a cost effective manner, it is necessary to assemble the electronic components to the circuit board panel at a high speed and with great precision. These goals are achieved through automated assembly.

In an automated manufacturing environment, the circuit board is created by assembling the electronic components on an empty circuit board panel via an automated part placement machine. An example of such a machine is the model FCP-IV chip part placement machine manufactured and sold by Fuji Machine Manufacturing Company. The automated part placement machine receives the empty circuit board panel from a conveyor. A leveling apparatus of the part placement machine lifts the circuit board panel off of the conveyor and positions it for part placement. A placement head of the part placement machine places the electronic components or "parts" in predetermined locations on the circuit board panel. The leveling apparatus then places the assembled circuit board onto the conveyor.

To remain competitive in the industry, manufacturers must be able to manufacture different circuit boards via a single assembly line. This often requires that manufacturing equipment be capable of assembling circuit boards from panels having different thicknesses. Because of the high cost of the automated part placement machine, it is desirable that all the circuit boards be assembled using one automated part placement machine.

To accommodate circuit board panels having different thicknesses, the height of the leveling apparatus of the automated part placement machine must be manually adjusted or "hard tooled" to compensate for the different thicknesses of the circuit board panels. Currently, the procedure for adjusting the leveling apparatus has several undesirable characteristics. To make adjustments, the automated part placement machine is taken off line. This results in costly production down time. Additionally, adjusting the height of the leveling apparatus is a tedious and time consuming task that requires trial and error techniques to perfect each time an adjustment is made. Placement of parts on the circuit board following manual adjustments is often marked with a reduction in quality, including incidents in which circuit board panels become damaged due to mispositioning attributable to improper height adjustment. The height adjustment must be compensated repeatedly until such errors are eliminated.

Therefore, what is needed is a leveling apparatus that does not require manual height adjustment between sequential manufacturing runs of circuit board panels or substrates having different thicknesses.

DETAILED DESCRIPTION OF THE PREFERRED EMBODIMENTS

An apparatus for leveling or positioning a circuit board against a rail to facilitate assembly of electrical components on the circuit board comprises a plate and at least one spring. The circuit board can have any one of a plurality of different predetermined thicknesses. The plate is positioned beneath the rail and has first and second sides. The first side is dimensioned to support the circuit board. The plate is moveable to a first predetermined distance from the rail. The first predetermined distance is no smaller than a smallest one of the plurality of different predetermined thicknesses of the circuit board. The at least one spring is carried on the second side of the plate to bias the plate towards the rail. The at least one spring is compressible to accommodate the circuit board having any one of the plurality of predetermined different thicknesses between the plate and the rail.

Figure 1:
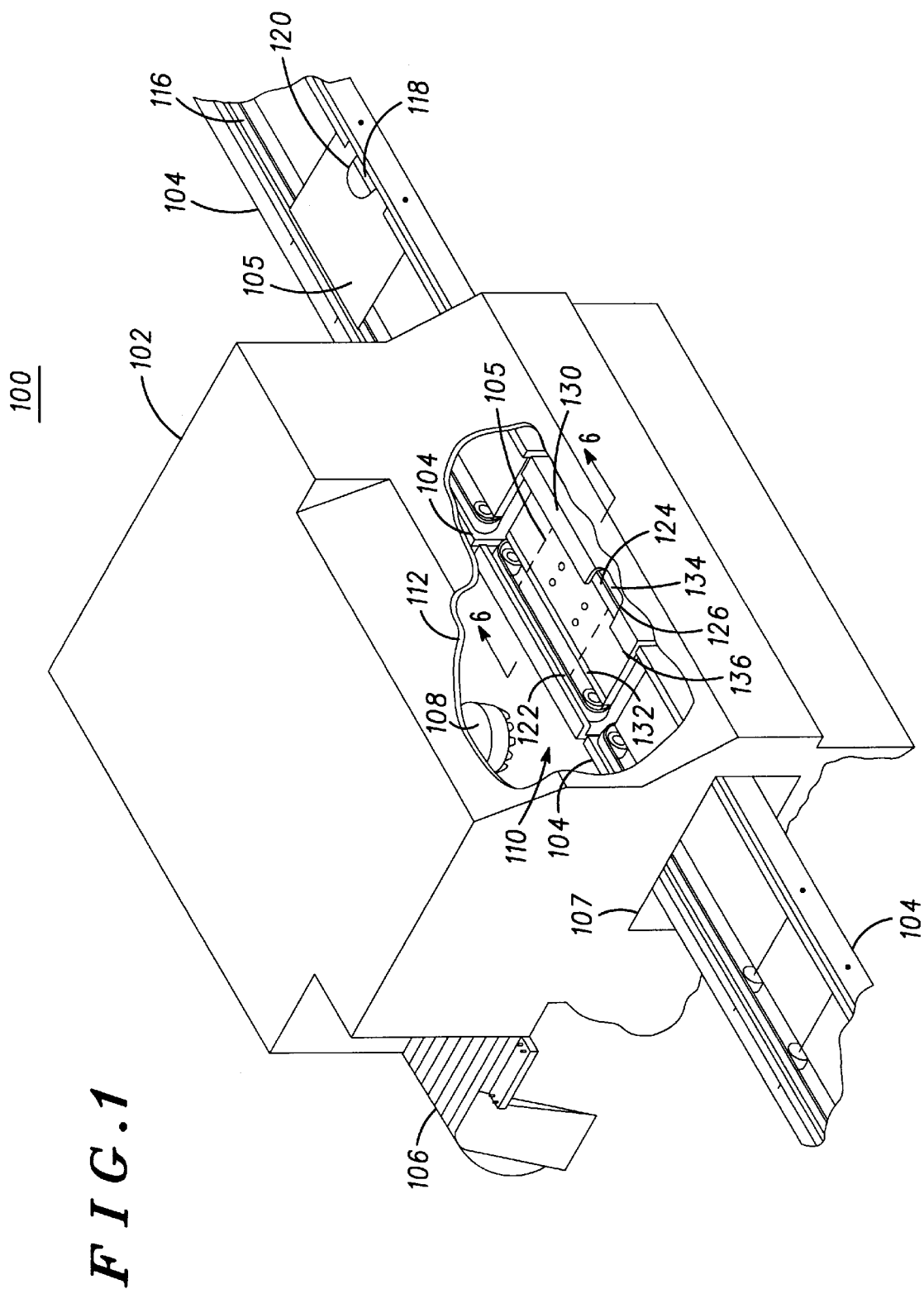
FIG. 1 illustrates a fragmentary view of an assembly line including a part placement machine employing a circuit board leveling apparatus.

FIG. 1 illustrates a section of assembly line 100. Assembly line 100 includes automated part placement machine 102 and conveyance 104. Circuit board panel 105 is transported via conveyance 104. Automated part placement machine 102 includes tape reels 106 containing electronic components. Automated part placement machine 102 includes side openings, such as side opening 107, placement head 108, and placement table 110, all viewable via cutaway 112. Side openings permit extension of conveyance 104 into automated part placement machine 102. Circuit board panel 105 enters automated part placement machine 102 via conveyance 104. Circuit board panel 105 is positioned in placement table 110. Placement head 108 picks electronic components from tape reels 106 and places the electronic components at predetermined locations on circuit board panel 105. Circuit board panel 105, once assembled, exits automated part placement machine 102 via conveyance 104 and side opening 107.

Conveyance 104 includes conveyor belts 116 and 118 (viewable via cutaway 120 in circuit board panel 105 ). Conveyor belts 116 and 118 extend along the length of conveyance 104. Conveyor belts 116 and 118 contact edges of circuit board panel 105 and propel circuit board panel 105 from right to left (or left to right, if desired) with respect to FIG. 1, into automated part placement machine 102.

Circuit board panel 105 can have any one of a plurality of different thicknesses. In the illustrated embodiment, circuit board panel 105 has a thickness ranging from 0.5 mm to 1.1 mm. Circuit board panel 105 is comprised of any suitable material, such as polyimide or epoxy-based flame retardant industrial fiberglass (G10-FR4).

Placement table 110 includes conveyor belts 122 and 124 (viewable via cutaway 126), rails 128 and 130, clamping rails 132 and 134 (viewable via cutaway 126), and leveling apparatus 136. Conveyor belts 122 and 124 are in alignment with conveyor belts 116 and 118 of conveyance 104, respectively, and work in conjunction therewith to deliver circuit board panel 105 into placement table 110 as shown in dotted line in FIG. 1. Rails 128 and 130 overhang conveyor belts 122 and 124, respectively. Clamping rails 132 and 134 are moveably disposed both next to and beneath conveyor belts 122 and 124, respectively. Clamping rails 132 and 134 coplanarly engage leveling apparatus 136. Leveling apparatus 136, which is further described below, positions circuit board panel 105 for assembly. Leveling apparatus employs a spring device that adjusts to accommodate any of the different thicknesses of circuit board panel 105 and to ensure planarity across circuit board panel 105.

Although illustrated in automated part placement machine 102, which can be any commercially available automated part placement machine, such as, for example, model FCP-IV manufactured and sold by Fuji Machine Manufacturing Co. or model GSM 1000 manufactured and sold by Universal, it will be recognized that leveling apparatus 136 can find application in a variety of other machines utilized in the manufacturing environment that require the circuit board panel to be positioned such that its top surface is level or planar. These machines include, but are not limited to, laser marking machines, automated optical inspection machines (which require a constant focal plane across the surface of the positioned circuit board), screen printing machines, and automated labeling machines.

Figure 2:
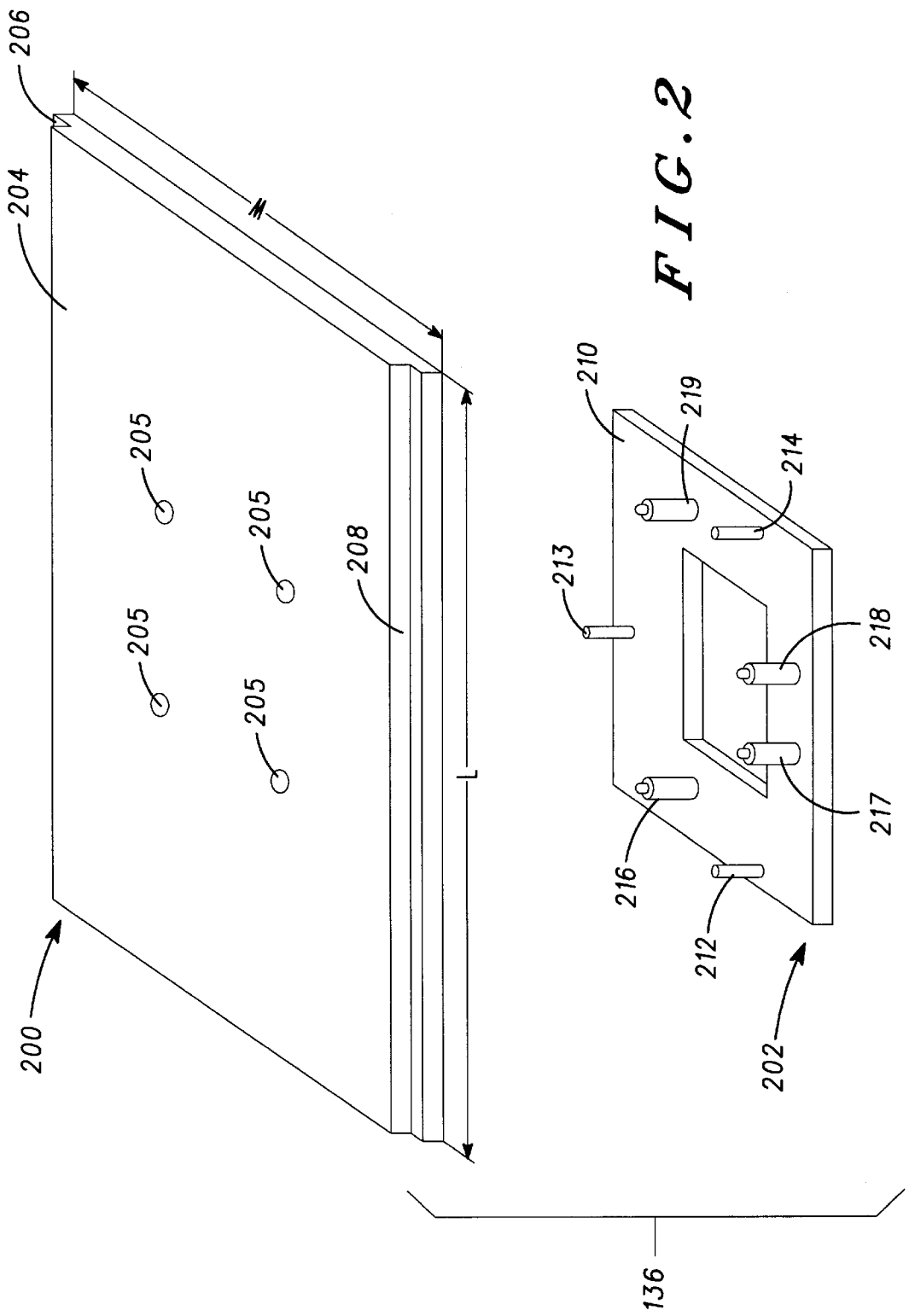
FIG. 2 illustrates an exploded top, front, and right side perspective view of the circuit board leveling apparatus of FIG. 1.
Figure 3:
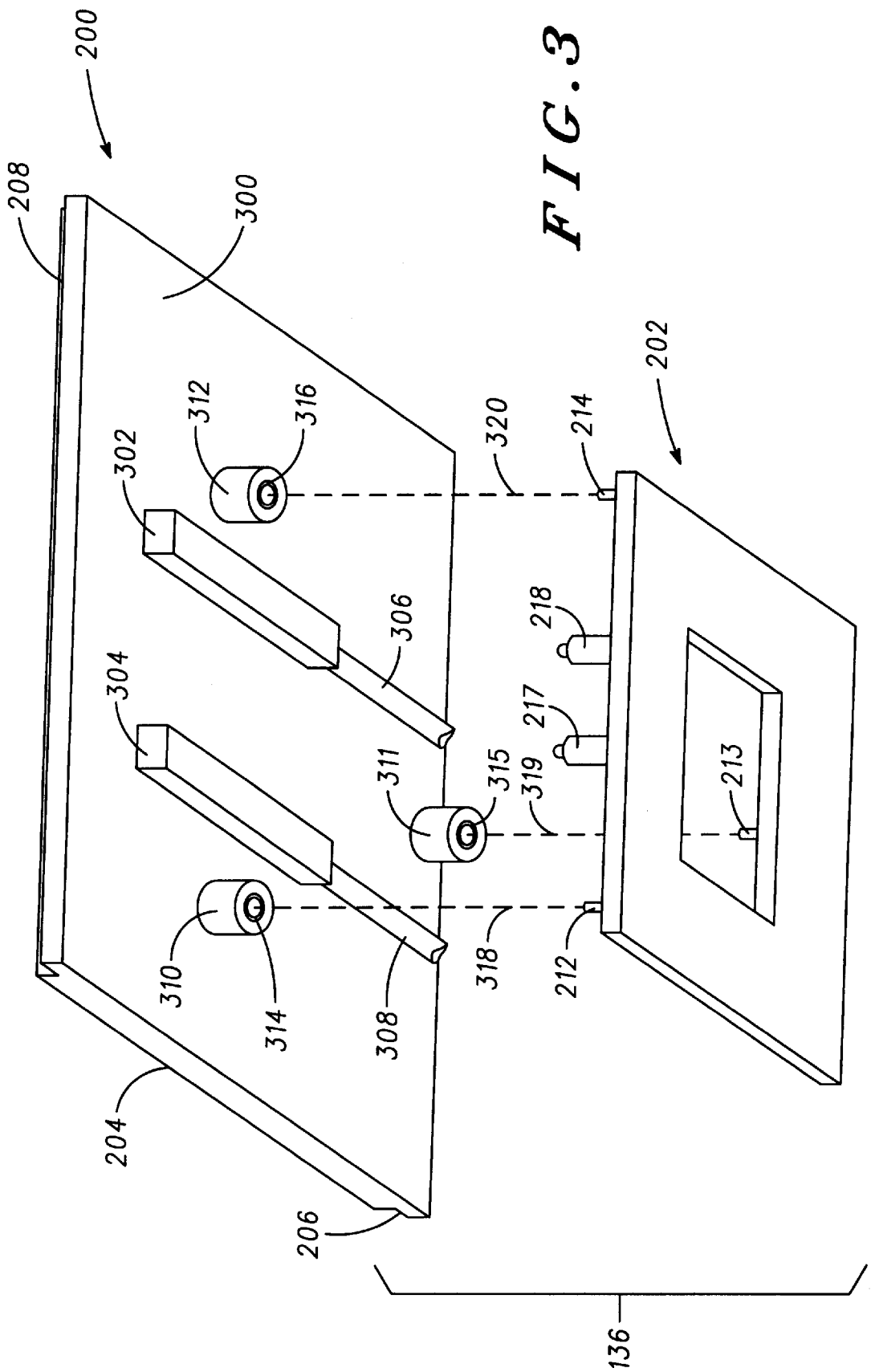
FIG. 3 illustrates an exploded bottom, front, left side perspective view of the circuit board leveling apparatus of FIG. 1.

Leveling apparatus 136 is further illustrated in FIGS. 2 and 3. Leveling apparatus 136 includes top plate portion 200 and base plate portion 202. Top plate portion 200 includes top side 204. Top side 204 is substantially planar. Top side 204 is dimensioned to substantially support circuit board panel 105. In the illustrated embodiment, circuit board panel 105 has a width of approximately 215 mm and a length of approximately 265 mm and top side 204 has a width, W, of approximately 200 mm and a length, L, of approximately 265 mm.

Top side 204 includes vacuum cups 205 recessed therein. Vacuum cups 205 provide a passage for air which creates vacuum suction to fix circuit board panel 105 of FIG. 1 against top side 204 during positioning. In the illustrated embodiment, vacuum cups 205 are arranged in two rows of two vacuum cups. Vacuum cups 205 are manufactured from any suitable material such as molded polymer or rubber, and can be any suitable, commercially available vacuum cups, such as those manufactured and sold by PIAB.

Top plate portion 200 includes cut-outs 206 and 208 that extend longitudinally along rear and front edges, respectively, of top plate portion 200. Cut-outs 206 and 208 engage clamping rails 132 and 134 of FIG. 1, respectively. Cut-outs 206 and 208 are sized to correspond to a thickness of clamping rails 132 and 134, respectively. In the illustrated embodiment, the 15 mm of width of circuit board panel 105 that overhangs top side 204, is substantially supported by clamping rails 132 and 134. Top plate portion 200 can be of any suitable construction, such as tooled from a durable material, such as 6061 T6 aluminum or the like.

Top plate portion 200 includes bottom side 300 of FIG. 3. Bottom side 300 includes manifolds 302 and 304. Manifolds 302 and 304 are mounted beneath vacuum cups 205 of FIG. 2. Manifolds 302 and 304 direct vacuum suction from air hoses 306 and 308, respectively, to vacuum cups 205. Air hoses 306 and 308 are further coupled to a vacuum pump (not shown) of automated part placement machine 102. In the illustrated embodiment, each one of manifolds 302 and 304 provides an air passage to one row of two vacuum cups of vacuum cups 205.

Bottom side 300 further includes bushings 310, 311, and 312. Bushings 310–312 are arranged to provide added stability to leveling apparatus 136 and ensure planarity of top surface 204 of top plate portion 200 during positioning of circuit board panel 105 of FIG. 1. Although three bushings are shown, one skilled in the art will recognize that leveling apparatus 136 could properly function via a single, centrally positioned bushing, two bushings, or more than three bushings. In the illustrated embodiment, bushings 310–312 are press fit into bottom side 300. Bushings 310–312 are tooled to extend approximately 20 mm from bottom side 300 and have a diameter of approximately 20 mm. Bushings 310–312 can be of any suitable construction, such as tooled from a durable material, such as 6061 T6 aluminum or the like. Bushings 310–312 employ linear bearing guides 314, 315, and 316, respectively. In the illustrated embodiment, linear bearing guides 314–316 are press fit into bushings 310–312. Linear bearing guides 314–316 have a bore lined with ball bearings (not shown). The bore may be 5–10 mm in diameter. Linear bearing guides 314–316 can be any suitable guides, such as those manufactured and sold by THK Co., Ltd.

Referring back to FIG. 2, base plate portion 202 includes top surface 210. Top surface 210 includes linear guide posts 212, 213, and 214. Linear guide posts 212–214 are arranged on top surface 210 to engage linear bearing guides 314–316 of bushings 310–312 of FIG. 3, respectively, when leveling apparatus 136 is assembled. Although, three posts are shown, one skilled in the art will recognize that leveling apparatus 136 could properly function via a single, central, post, two posts, or more than three posts. In the illustrated embodiment, linear guide posts 212–214 are press fit into top surface 210. Linear guide posts 212–214 are tooled to extend approximately 30 mm above top surface 210 and have a diameter that slidably engages linear bearing guides 314–316. Base plate portion 202 and linear guide posts 212–214 can be of any suitable construction, such as tooled from a durable material, such as 6061 T6 aluminum or the like.

Figure 4:
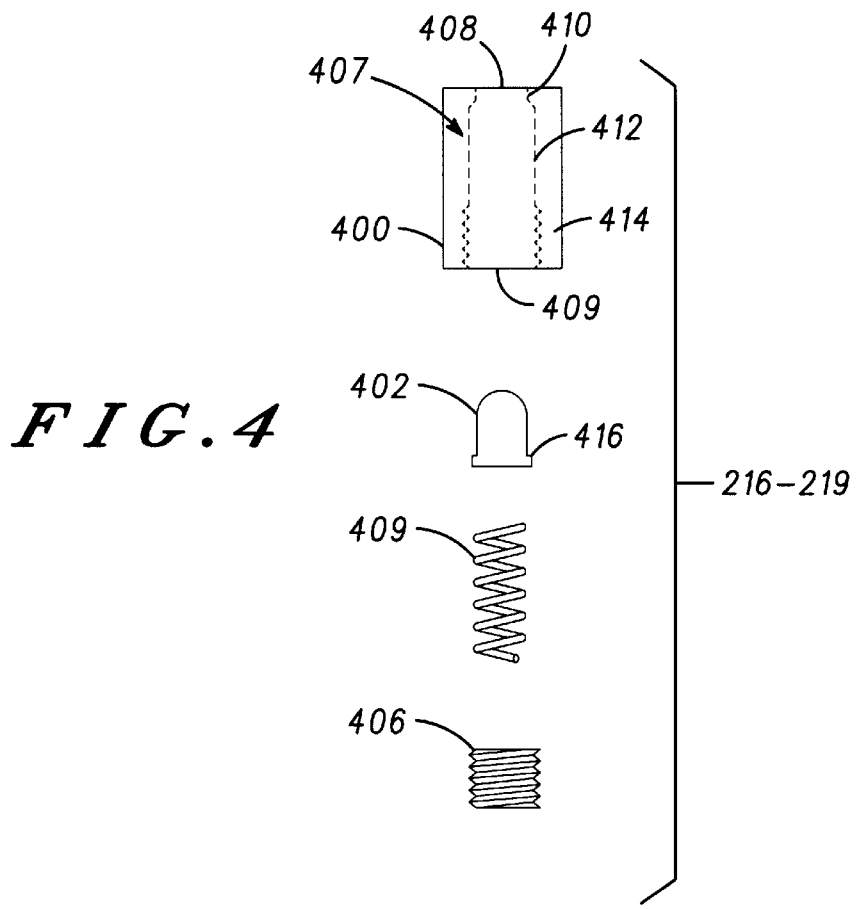
FIG. 4 illustrates an exploded view of a spring device employed by the circuit board leveling apparatus of FIG. 1.

Top surface 210 of base plate portion 202 includes spring plungers 216, 217, 218, and 219. In FIG. 4, each one of spring plungers 216–219 is shown to include body 400, nose 402, spring 404, and plug 406. Body 400 includes inner bore 407 extending between top and bottom openings 408 and 409 of body 400, as shown in dotted line. Inner bore 407 includes neck 410, central portion 412, and threaded portion 414. Nose 402 includes radial flange 416. Plug 406 is threaded so as to mate with threaded portion 414 of body 400.

Spring 404 is a compression spring exhibiting a predetermined spring force. Spring 404 compresses to accommodate different thicknesses of circuit board panel 105 when circuit board panel 105 of FIG. 1 is positioned against rails 128 and 130 of FIG. 1. The predetermined spring force must be large enough to hold the thinnest accommodated circuit board panel 105, yet not large enough to damage the thickest accommodated circuit board panel 105. In a reduction to practice, force gauge testing (using, for example, a force gauge manufactured and sold by Chatillon Inc.) indicated that the maximum force or load that circuit board panel 105 could withstand was 2.9 lbs. As such, the force supplied by spring 404 was set to be less than 2.9 lbs for circuit board panel 105 having a thickness of 1.1 mm.

Spring plungers 216–219 are assembled by inserting nose 402 into neck 410 of inner bore 407 via bottom opening 409 until nose 402 extends through top opening 408 and radial flange 416 of nose 402 abuts neck 410 of inner bore 407. Next, spring 404 is inserted into central portion 412 of inner bore 407 via bottom opening 409 until a first end of spring 404 abuts nose 402. Next, plug 406 is screwed into threaded portion 414 of inner bore 407. Plug 406 engages a second end of spring 404 and compresses, or preloads, spring 404. In the illustrated embodiment, spring plungers 216–219 are of type S-61N/no. 1/2 - 13 manufactured by Vlier and sold by McMaster-Carr. This spring plunger is preloaded to 2.7 lbs with a final end force of 9.3 lbs. A spring, such as spring 404, employed by this spring plunger has a spring constant (k) of 0.114 lbs/mm. If this spring is deflected 1.1 mm to accommodate the thickest one of circuit board panel 105, Hookes Law of F=k*x (where F is the exerted force or load, k is the spring constant, and x is the amount of deflection) indicates that this spring exerts a force or load of F=(0.114 lbs/mm)*(1.1 mm)=0.1254 lbs. Adding this force to the preloaded value of this spring, the largest total force exerted on circuit board panel 105 becomes 2.8254 lbs (2.7 lbs+ 0.1254 lbs). This is less than the maximum allowable force of 2.9 lbs that circuit board panel 105 is capable of withstanding.

Spring plungers 216–219 are arranged to uniformly provide spring forces across the bottom surface 300 of top plate portion 200 when leveling apparatus 136 is assembled. In the illustrated embodiment shown in FIGS. 2 and 3, spring plungers 216–219 are press fit into base plate portion 202.

Figure 5:
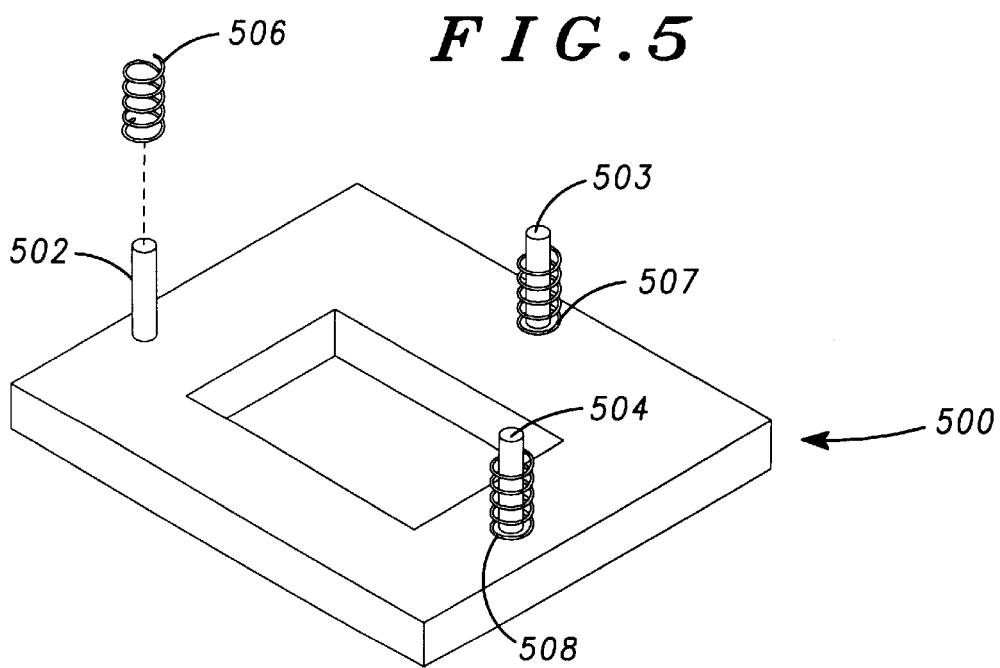
FIG. 5 illustrates a top, front, and right side perspective view of an alternate base portion of the circuit board leveling apparatus of FIG. 1.

An alternative base plate portion 500 is shown in FIG. 5. Base plate portion 500 includes linear guide posts 502, 503, and 504. Linear guide posts 502–504 are similar in dimension and arrangement to linear guide posts 212–214 of FIGS. 2 and 3. Rather than employing spring plungers 216–219 of FIGS. 2 and 3, base plate portion 500 includes unloaded springs 506, 507, and 508. Unloaded springs 506–508 are positioned such that linear guide posts 502–504, respectively, extend therethrough. That is, unloaded springs 506–508 reside coaxially with linear guide posts 502–504, respectively. In the illustrated alternative embodiment, unloaded springs 506–508 are chosen such that the force exerted thereby does not exceed 2.9 lbs. Applying Hookes Law of F=k*x and again assuming that the thickest accommodated circuit board panel 105 is 1.1 mm, the spring constant (k) of unloaded springs 506–508 must not exceed k=F/x=2.9 lbs/1.1 mm=2.636 lbs/mm. Assuming that the spring constant (k) is 2.636 lbs/mm and deflection due to the thinnest accommodated circuit board panel 105 is 0.5 mm, unloaded springs 506–508 exert 1.318 lbs (F=(2.636 lbs/mm)*(0.5 mm)) of force. Such force is sufficient to maintain positioning of the thinnest accommodated circuit board panel 105 during part placement.

Referring back to FIG. 3, top plate portion 200 and base plate portion 202 (as well as base plate portion 500 of FIG. 5) are assembled by inserting linear guide posts 212–214 (or linear guide posts 502–504 of FIG. 5) into linear guide inserts 314–316 of bushings 310–312, respectively. Such assembly is illustrated by dotted lines 318, 319, and 320. To prevent disengagement of base plate portion 500 of FIG. 5 once leveling apparatus 136 is assembled, unloaded springs 506–508 extend to only a portion, such as three-fourths, of the height of linear guide posts 502–504. This allows linear guide inserts 314–316 to engage at least the remaining portion, such as one-fourth, of linear guide posts 502–504. Once assembled, unloaded springs 506–508 extend between and abut top surface 210 of base plate portion 202 and linear guide inserts 314–316 and/or bushings 310–312.

Although three or four spring devices (e.g., four spring plungers or three unloaded springs) are shown in FIGS. 2–5, those skilled in the art will recognize that a single, centrally positioned, spring device containing a single spring could provide sufficient force across the top plate portion 200 of leveling apparatus 136 and ensure proper positioning of circuit board panel 105 thereby. One skilled in the art will also recognize that two, five, or more of such spring devices could alternatively be used.

Figure 6:
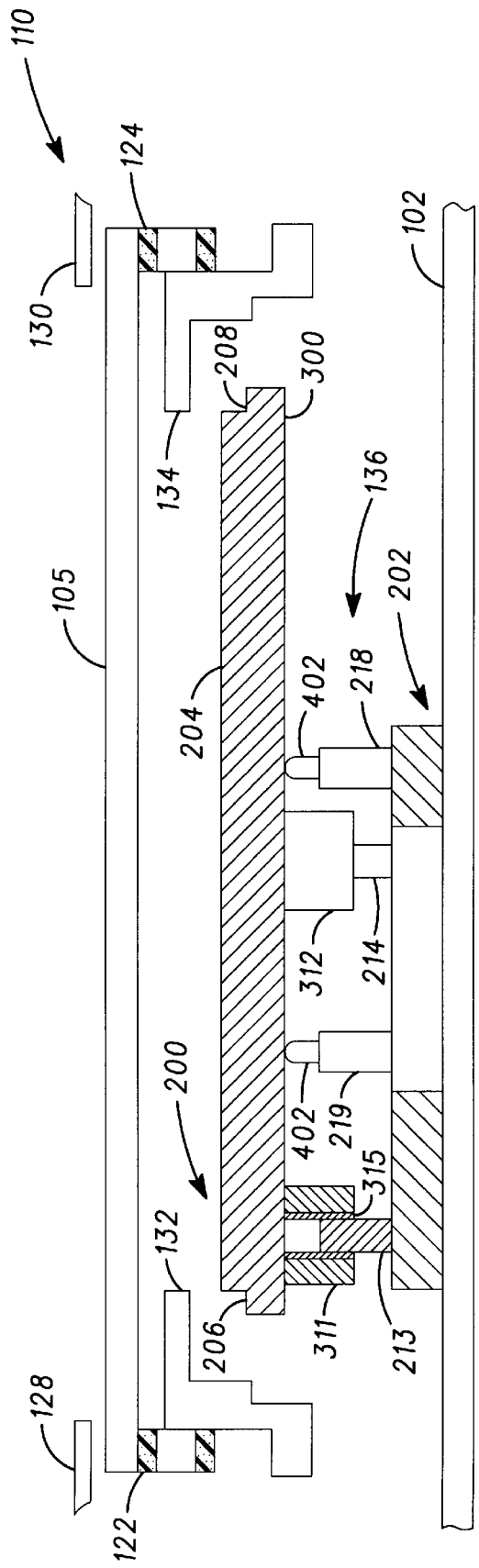
FIG. 6 illustrates an enlarged cross-sectional view of the part placement machine and the circuit board leveling apparatus in a rest position taken along section lines 6—6 in FIG. 1.

Once assembled, bottom side 300 of top plate portion 200 rests against nose 402 of spring plungers 216–219 in the manner specifically illustrated in FIG. 6 by spring plungers 218 and 219. Also, linear guide posts 212–214 reside in linear bearing guides 314–316 of bushings 310–312, respectively, in the manner specifically illustrated by linear guide post 213, linear bearing guide 315 and bushing 311. Base plate portion 202 include throughholes (not shown) that engage posts (not shown) of automated part placement machine 102 so as to securely fasten leveling apparatus 136 to automated placement machine 102. In FIG. 6, leveling apparatus 136 is shown in rest position 600. In rest position 600, circuit board panel 105 remains positioned on conveyor belts 122 and 124.

Figure 7:
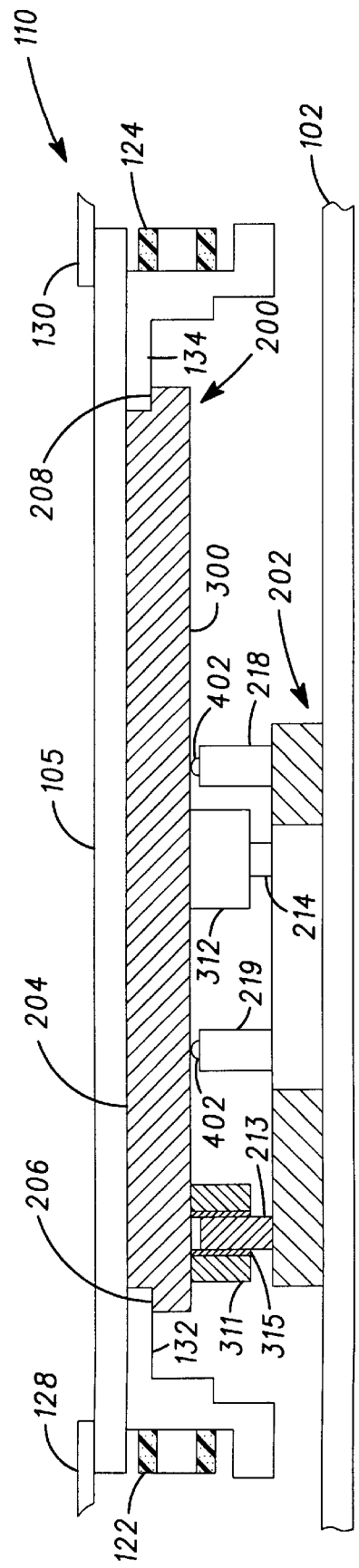
FIG. 7 illustrates an enlarged cross-sectional view of the part placement machine and the circuit board leveling apparatus in an engagement position taken along section lines 6—6 in FIG. 1.

To position circuit board panel 105 against rails 128 and 130 for part placement by placement head 108 of FIG. 1, automated part placement machine 102 raises leveling apparatus 136. As leveling apparatus 136 is raised, clamping rails 132 and 134 engage cut-outs 206 and 208 in top plate portion 200, respectively. As leveling apparatus 136 is further raised, top side 204 of top plate portion 200 and clamping rails 132 and 134, which together form a planar support surface, lift circuit board panel 105 off of conveyor belts 122 and 124. When top side 204 contacts circuit board panel 105, vacuum cups 205 of FIG. 2 juxtapose with circuit board panel 105. Suction secures circuit board panel 105 in position upon top side 204 to prevent shifting during further raising. For clarity, manifolds 302 and 304 of FIG. 3 have been removed from FIGS. 6 and 7. The arrangement of linear guide posts 212–214 and bushings 310–312 (see FIGS. 2, 3, and 5) prevents lateral movement and twisting of the top plate portion 200 and, thus, ensures that circuit board panel 105 remains level during raising.

Automated part placement machine 102 always assumes that the thinnest accommodated circuit board panel 105 is being positioned for part placement. As such, automated part placement machine 102 always raises base plate portion 202 of leveling apparatus 136 to a predetermined position, which is engagement position 700 of FIG. 7. In the illustrated embodiment, assuming top side 204 is initially 20 mm from bottom edges of rails 128 and 130 when leveling apparatus 136 is in rest position 600 and the thinnest accommodated circuit board panel 105 is 0.5 mm, base plate portion 202 is raised slightly more than 19.5 mm.

Prior to reaching engagement position 700, top side edges of circuit board panel 105 engage bottom edges of rails 128 and 130. At such time, bottom side 300 of top plate portion 200 will deflect nose 402 of spring plungers 216–219 to accommodate circuit board panel 105 between rails 128 and 130 and top side 204 of top plate portion 200 and clamping rails 132 and 134 as base plate portion 202 keeps moving. The selection and arrangement of spring plungers 216–219 ensures even, uniform application of the spring force across circuit board panel 105. The arrangement of linear guide posts 212–214 and bushings 310–312 ensure that circuit board panel 105 remains level during deflection. Deflection of spring plungers 216–219 will continue until leveling apparatus 136 reaches engagement position 700. In this manner circuit board panel 105 with a large thickness is accommodated without manual adjustment or injury to circuit board panel 105. Once in engagement position 700, part placement by placement head 108 of FIG. 1 can begin.

Thus it can be seen that a leveling apparatus in an automated part placement machine can be self adjusting to accommodate circuit board panels having any one of a plurality of different thicknesses. By employing spring devices, such as spring plungers, one can avoid the costly production down time necessary to manually adjust the leveling apparatus between sequential production runs of circuit boards having different thicknesses. As such, the self adjusting leveling apparatus provides for a more versatile manufacturing environment.

What is claimed is:

1. An apparatus for leveling a circuit board against a rail, the circuit board having one of a plurality of different predetermined thicknesses, the apparatus comprising:
    a plate positioned beneath the rail, the plate having a first side and a second side, the first side of the plate dimensioned to support the circuit board, the plate being moveable in an upward direction to within a first predetermined distance from the rail, the first predetermined distance no smaller than a smallest one of the plurality of different predetermined thicknesses of the circuit board;
    at least one bushing carried on the second side of the plate;
    a base positioned beneath the plate;
    at least one spring carried on the second side of the plate to bias the plate towards the rail, the at least one spring, during leveling of the circuit board against the rail, is compressible to accommodate the circuit board having any one of the plurality of different predetermined thicknesses between the plate and the rail; and
    at least one post, one end of the at least one post carried on the base, an other one of the at least one post received by the at least one bushing to restrict lateral movement of the plate during leveling of the circuit board against the rail.

2. The apparatus according to claim 1 wherein the at least one post is positioned to extend through the at least one spring thereby capturing the at least one spring between the base and the at least one bushing, the at least one post having a length longer than a length of the at least one spring.

3. The apparatus according to claim 1 wherein the at least one bushing has a receptacle for receiving the at least one post at the other one of the ends thereof, the receptacle having a depth larger than the range of compression to accommodate the at least one post during operation.

4. The apparatus according to claim 1 wherein the at least one spring is a spring plunger, the spring plunger comprising a body, a pre-compressed spring element positioned in the body, and a nose abutting the pre-compressed spring element and extending from the body, the body mounted to the base, and the nose positioned in contact with the second side of the plate.

5. The apparatus according to claim 1 wherein
    the at least one spring comprises a first spring, a second spring, and a third spring, the first and second springs spaced apart along a first plane, the third spring positioned along a second plane, the second plane spaced from, and parallel to, the first plane,
    the at least one post comprises a first post, a second post, and a third post, the first and second posts spaced apart along a third plane, the third post positioned along a fourth plane, the third plane spaced from, and parallel to, the fourth plane, and
    the at least one bushing comprises a first bushing to receive the first post, a second bushing to receive the second post, and a third bushing to receive the third post.

6. An apparatus for leveling a circuit board against a rail, the circuit board having one of a plurality of different predetermined thicknesses, the apparatus comprising:
    a plate positioned beneath the rail, the plate having a first side and a second side, the first side of the plate dimensioned to support the circuit board, the plate being moveable in an upward direction to within a first predetermined distance from the rail, the first predetermined distance no smaller than a smallest one of the plurality of different predetermined thicknesses of the circuit board;
    at least one spring carried on the second side of the plate to bias the plate towards the rail, the at least one spring, during leveling of the circuit board against the rail, is compressible to accommodate the circuit board having any one of the plurality of different predetermined thicknesses between the plate and the rail; and
    a vacuum system coupled to the plate to fixably secure the circuit board during leveling of the circuit board against the rail, the vacuum system comprising at least one vacuum cup carried on the first side of the plate, and at least one manifold carried on the second side of the plate, the at least one manifold connected to the at least one vacuum cup by a passage.

7. The apparatus according to claim 6 further comprising:
    at least one bushing carried on the second side of the plate, and
    at least one post, one end of the at least one post carried on the base, an other one of the at least one post received by the at least one bushing to restrict lateral movement of the plate during leveling of the circuit board against the rail.

8. The apparatus according to claim 7 wherein the at least one post is positioned to extend through the at least one spring thereby capturing the at least one spring between the base and the at least one bushing, the at least one post having a length longer than a length of the at least one spring.

9. The apparatus according to claim 7 wherein the at least one bushing has a receptacle for receiving the at least one post at the other one of the ends thereof, the receptacle having a depth larger than a range of compression necessary to accommodate the at least one post during leveling of the circuit board against the rail.

10. The apparatus according to claim 7 wherein the at least one spring is a spring plunger, the spring plunger comprising a body, a pre-compressed spring element positioned in the body, and a nose abutting the pre-compressed spring element and extending from the body, the body mounted to the base, and the nose positioned in contact with the second side of the plate.

11. The apparatus according to claim 7 wherein
    the at least one spring comprises a first spring, a second spring, and a third spring, the first and second springs spaced apart along a first plane, the third spring positioned along a second plane, the second plane spaced from, and parallel to, the first plane,
    the at least one post comprises a first post, a second post, and a third post, the first and second posts spaced apart along a third plane, the third post positioned along a fourth plane, the third plane spaced from, and parallel to, the fourth plane, and
    the at least one bushing comprises a first bushing to receive the first post, a second bushing to receive the second post, and a third bushing to receive the third post.

12. A part placement machine for placing parts on a circuit board, the circuit board having one of a plurality of different predetermined thicknesses, the part placement machine comprising:

a rail having a first edge and a second edge, the first edge and the second edge being coplanar;

a conveyor having a first belt and a second belt, the first belt positioned beneath the first edge of the rail and supporting one end of the circuit board, the second belt positioned beneath the second edge of the rail and supporting an other end of the circuit board;

a base disposed beneath the conveyor and being moveable in a first plane between a rest position and an engagement position;

a plurality of springs carried on the base and extending upward therefrom;

a plurality of posts carried on the base; and a plate carried on the plurality of springs and the plurality of posts, the plate, when the base is in the rest position, positioned beneath the first and second belts of the conveyor, the plate, when being moved to the engagement position, lifting the circuit board off of the first and second belts of the conveyor, abutting the one end of circuit board against the first edge of the rail, and abutting the other end of the circuit board against the second edge of the rail, the plurality of posts restricting lateral movement of the plate, and the plurality of springs being compressible to accommodate the circuit board having any one of the plurality of different predetermined thicknesses between the plate and the rail.

13. The apparatus placement machine according to claim 12 wherein the plate has a first side and a second side, and further comprising a plurality of bushings carried on the second side of the plate, each one of the plurality of bushings receiving a corresponding one of the plurality of posts.

14. The apparatus placement machine according to claim 13 wherein each one of the plurality of posts is positioned to extend through a corresponding one of the plurality of springs thereby capturing the plurality of springs between the base and corresponding ones of the plurality of bushings, each one of the plurality of posts having a length longer than a length of each one of the plurality of springs.

15. The apparatus part placement machine according to claim 12 wherein each one of the plurality of springs exerts during deflection, a force that is less than a maximum allowable force which the circuit board can withstand.

16. The apparatus part placement machine according to claim 12 wherein the plate has a first side and a second side, and the first side of the plate is dimensioned to underlie about 93 percent of the circuit board.

17. The apparatus part placement machine according to claim 12 wherein the plate has a first side and a second side, and each one of the plurality of springs is a spring plunger, the spring plunger comprising a body, a pre-compressed spring element positioned in the body, and a nose abutting the pre-compressed spring element and extending from the body, the body mounted to the base, and the nose positioned in contact with the second side of the plate.

18. The apparatus placement machine according to claim 12 wherein the plate has a first side and a second side, and further comprising a vacuum system coupled to the plate to fixably secure the circuit board during engagement, the vacuum system comprising at least one vacuum cup carried on the first side of the plate and at least one manifold carried on the second side of the plate, the at least one manifold connected to the at least one vacuum cup by a passage.

19. The apparatus placement machine according to claim 12 the plurality of springs comprise a first spring, a second spring, and a third spring, the first and second springs spaced apart along a first plane, the third spring positioned along a second plane, the second plane spaced from, and parallel to, the first plane, and the plurality of posts comprises a first post, a second post, and a third post, the first and second posts spaced apart along a third plane, the third post positioned along a fourth plane, the third plane spaced from, and parallel to, the fourth plane.

20. The apparatus placement machine according to claim 12 further comprising a clamping rail moveably positioned between the rail and the plate, the clamping rail engageable by the plate to further support the circuit board during engagement.

* * * * *

UNITED STATES PATENT AND TRADEMARK OFFICE
CERTIFICATE OF CORRECTION

PATENT NO. : 6,035,522
DATED : March 14, 2000
INVENTOR(S) : Larson et al.

It is certified that error appears in the above-indentified patent and that said Letters Patent is hereby corrected as shown below:

Claims 15, 16 and 17, line 1:

Please delete "part" after The Apparatus

Signed and Sealed this

Twenty-seventh Day of March, 2001

Attest:

NICHOLAS P. GODICI

Attesting Officer     *Acting Director of the United States Patent and Trademark Office*